United States Patent
Chiu et al.

[11] Patent Number: 6,150,195
[45] Date of Patent: Nov. 21, 2000

[54] METHOD FOR AN INTEGRATED CIRCUIT THERMAL GREASE MESH STRUCTURE

[75] Inventors: Chia-Pin Chiu, Chandler, Ariz.; Nadir Sharaf, Turn Water, Wash.; Gary Solbrekken, Chandler; Correy D. Cooks, Phoenix, both of Ariz.

[73] Assignee: Intel Corporation, Santa Clara, Calif.

[21] Appl. No.: 09/356,013

[22] Filed: Jul. 16, 1999

Related U.S. Application Data

[62] Division of application No. 09/251,379, Feb. 16, 1999.

[51] Int. Cl.$^7$ ................................................ H01L 21/48
[52] U.S. Cl. ......................... 438/118; 438/119; 438/122
[58] Field of Search ................................... 438/118, 119, 438/122; 257/714, 719, 720, 746, 747, 712, 713; 361/688, 689, 699, 704, 705, 706, 707, 708

[56] References Cited

U.S. PATENT DOCUMENTS

| | | | |
|---|---|---|---|
| 4,130,233 | 12/1978 | Chisholm | 228/126 |
| 4,295,151 | 10/1981 | Nyul et al. | 257/746 |
| 4,384,610 | 5/1983 | Cook et al. | 165/80 |
| 4,446,916 | 5/1984 | Hayes | 165/185 |
| 4,482,912 | 11/1984 | Chiba et al. | 257/746 |
| 5,323,294 | 6/1994 | Layton et al. | . |
| 5,459,352 | 10/1995 | Layton et al. | 257/724 |
| 5,783,862 | 7/1998 | Deeney | 257/714 |
| 6,037,658 | 3/2000 | Brodsky et al. | 257/707 |

*Primary Examiner*—John Guay
*Assistant Examiner*—Alonzo Chambliss
*Attorney, Agent, or Firm*—Blakely, Sokoloff, Taylor & Zafman LLP

[57] ABSTRACT

The invention includes a method for assembling an integrated circuit package. In the method, a substrate is presented. Next, an integrated circuit may be mounted to the substrate. A retaining structure is presented that is shaped as a mesh that is at least one of a hexagonal mesh, a triangular mesh, and an irregular shaped mesh. The retaining structure is then impregnated with a thermal grease to form a heat pipe. The heat pipe is trimmed to the perimeter of the top surface so that the heat pipe does not extend into the at least one corner of the top surface. The heat pipe is placed on the top surface of the integrated circuit. A thermal element is then placed on the impregnated retaining structure.

3 Claims, 1 Drawing Sheet

METHOD FOR AN INTEGRATED CIRCUIT THERMAL GREASE MESH STRUCTURE

This is Divisional Application under 37 CFR 1.53 (b) in connection with prior U.S. patent application Ser. No. 09/251,379, filed Feb. 16, 1999 now pending.

BACKGROUND OF THE INVENTION

1. Field of the Invention

The present invention relates to an integrated circuit package.

2. Background Information

Integrated circuits are typically assembled into a package that is mounted to a printed circuit board. There are many types of integrated circuit packages including quad flat pack, pin grid array and plastic ball grid array (PBGA) packages. A PBGA package typically contains an integrated circuit which is mounted to a substrate. A plurality of solder balls are attached to a bottom surface of the substrate and reflowed to mount the package to a printed circuit board. The printed circuit board may be a motherboard of a computer system. The substrate may have routing traces and vias which connect the integrated circuit to the solder balls.

The integrated circuit of a PBGA package may be exposed or enclosed by a protective plastic material. The outer plastic material is typically formed with an injection mold process. The integrated circuit generates heat which must be removed from the package. To facilitate the removal of heat generated by the integrated circuit, it may be desirable to couple a thermal element such as a heat sink to the plastic housing, for example at the top surface of the package.

It has been found that the injection mold process may cause the package to warp. This warpage will create a lack of flatness in the top surface of the plastic housing. The lack of flatness may create air voids between the plastic housing and a thermal element that is mounted to the package. Since air has a relatively low coefficient of thermal conductivity, any air voids in the package/thermal element interface will increase the thermal impedance from the integrated circuit to the thermal element. This increase in thermal impedance may raise the junction temperatures of the integrated circuit.

To maintain the junction temperatures below a threshold design value, it is desirable to remove the air voids between the plastic housing and a thermal element that is mounted to the package. One known technique is an integrated circuit package having a non-grease type of thermal interface material that attaches a thermal element to a package housing mounted on a substrate.

FIG. 1 shows an exploded elevation view of what is known in the art. Integrated circuit package 10 comprises heat sink 12 coupled to integrated circuit 14 that is coupled to substrate 16. Placed between the heat sink 12 and the integrated circuit 14 is thermal interface material 18. Although the use of thermal grease is preferred in reducing thermal resistance between the package and the thermal element, the thermal performance of such grease has been found to degrade primarily through grease pump-out, separation, and dry out. This degradation especially is pronounced after power cycle testing. Alternative materials such as thermally conductive tapes, elastomers, and epoxies have been tried for thermal interface material 18, but have been found to lack the competitive thermal performance of thermal grease. It would be desirable to provide an integrated circuit package that incorporates a thermal grease without creating pump-out, separation, dry out, and other package degrading conditions.

SUMMARY OF THE INVENTION

One embodiment of the present invention is an integrated circuit package which may have an integrated circuit mounted to a substrate where a thermal element is thermally coupled to the integrated circuit. Thermal grease is retained to a location between the integrated circuit and the thermal element by the retaining structure. Other features are disclosed.

DETAILED DESCRIPTION OF THE INVENTION

Figure 1:
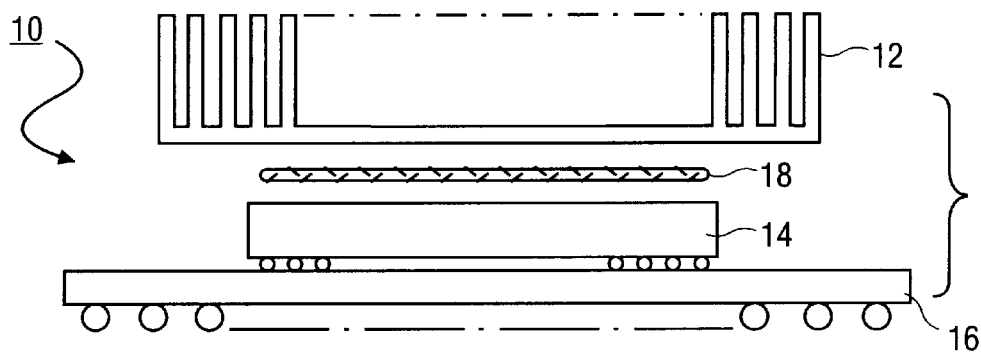
FIG. 1 is an exploded side elevation view of an integrated circuit package of the prior art.
Figure 2:
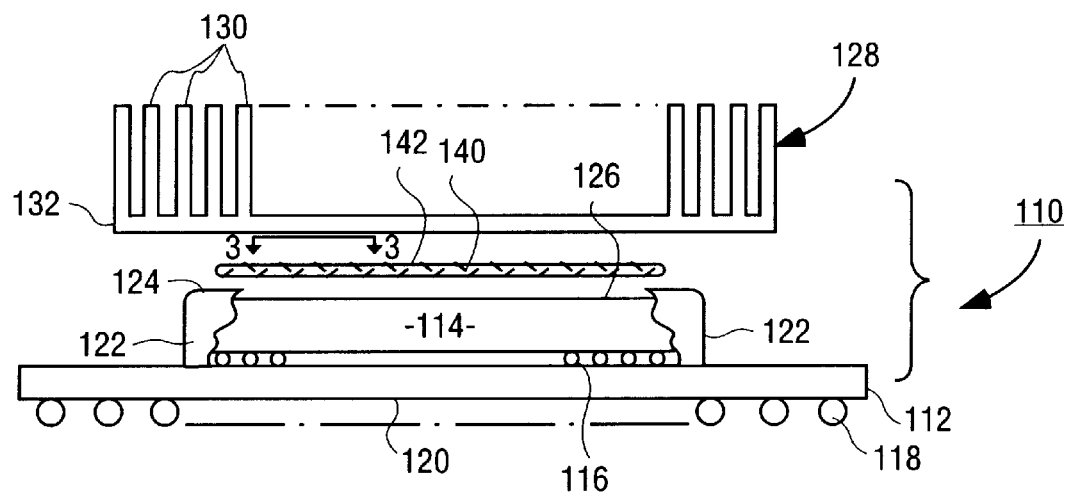
FIG. 2 is an exploded elevation view of an embodiment of an integrated circuit package showing a retaining structure that restricts thermal grease to a position between a thermal element and a package housing.

Referring to the drawings more particularly by reference numbers, FIG. 2 is an exploded elevation view of an embodiment of an integrated circuit package 110. The integrated circuit package 110 may include a substrate 112 electrically coupled to an integrated circuit 114 by solder bumps 116 utilized in a process commonly referred to as controlled collapsed chip connection (C4). Although solder bumps 116 are shown and described, it is to be understood that the integrated circuit 114 may be connected to the substrate 112 by other means such as bond wires.

The integrated circuit package 110 may include a plurality of solder balls 118 that are attached to a bottom surface 120 of the substrate 112. The solder balls 1 18 may be reflowed to attach the integrated circuit package 110 to a printed circuit board (not shown). The substrate 112 may contain routing traces, surface pads, power/ground planes and vias, etc. which electrically connect the solder balls 118 with the solder bumps 116. Although solder balls 118 are shown and described, it is to be understood that the package 110 may have other contacts such as pins.

Integrated circuit 114 may be enclosed by the housing 122 that is attached to substrate 112. Housing 122 may be constructed from a plastic injection mold material. The injection mold process may cause a warpage in package 110 so that top surface 124 of housing 122 has a lack of flatness. The warpage may be caused by the differential thermal contraction of plastic housing 122 and substrate 112 when integrated circuit package 110 cools down during the injection process.

In another embodiment, integrated circuit 114 may be attached to substrate 112 without housing 122. For example, the plurality of solder balls 118 may be mechanically as well as electrically sufficient to attach integrated circuit 114 to the substrate 112. Even without the housing 122, the surface 126 of the integrated circuit 114 has its own lack of flatness due to, for example, normal manufacturing procedures or thermal warpage.

Integrated circuit 114 generates heat which must be removed from integrated circuit package 110. A thermal element 128 may be thermally coupled to integrated circuit 114 through housing 122 to facilitate the removal of heat from the integrated circuit 114. The thermal element 128 may be a heat sink which has a plurality of fins 130 that extend from pedestal 132. Fins 130 increase the effective thermal area of the heat sink and improve the heat transfer rate of integrated circuit package 110.

To decrease the thermal impedance between the integrated circuit 114 and the thermal element 128, retaining structure 140 may be impregnated with thermal grease 142 and placed between the integrated circuit 114 and the thermal element 128. The retaining structure 140 preferably is a mesh that is trimmed to conform with the exterior profile of the top surface of either housing 122 or integrated circuit 114. For clearance purposes, where top surface 124 of housing 122 has four corners, retaining structure 140 need not extend into the four corners of top surface 124.

Figure 3:
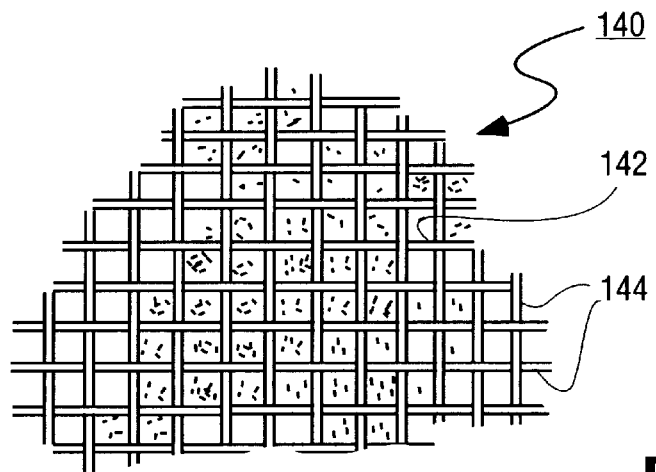
FIG. 3 is an enlarged top view taken generally on line 3—3 of FIG. 2 of an impregnated mesh pattern for a retaining structure.

FIG. 3 is an enlarged top view taken of an impregnated mesh pattern for a retaining structure. The retaining structure 140 may be a fabric woven of strands 144 that are interlaced at regular intervals to form a square mesh with a mesh count comprised of the number of open areas. It is preferable to match the mesh opening area, mesh count, thread diameter, and fabric thickness to the type of thermal grease 142. The retaining structure 140 may be open as shown in FIG. 3 or may be any other fabric structure that can be adapted to be impregnated with thermal grease. The fabric may be made of metal, nylon, glass fiber, polyester, or other suitable material. The intervals may also be irregular intervals to form an irregular shaped mesh. Other patterns such as hexagonal mesh, triangular mesh, and the like may also be used.

Table I provides the results of tests performed on an organic land grid array (OLGA) flip chip package using ShinEtsu G749 grease manufactured by the ShinEtsu Corporation of Tokyo, Japan and known die-referencing thermal plates. Although the best results appeared without using mesh material, it would be desirable to provide an integrated circuit package that incorporates a thermal grease 142 without creating pump-out, separation, dry out, and other package degrading conditions. Thus, mesh material converted from aluminum having a mesh opening of 2.9 mils provided favorable results.

surface. Preferably, the mesh is as thin as possible to shorten the heat transfer path between the integrated circuit 114 and the thermal element 128.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art.

What is claimed is:

1. A method for assembling an integrated circuit package, comprising:
    presenting a substrate;
    mounting an integrated circuit to the substrate, the integrated circuit having a top surface, the top surface having a perimeter having at least one corner;
    presenting a retaining structure shaped as a mesh that is at least one of a hexagonal mesh, a triangular mesh, and an irregular shaped mesh;
    impregnating the retaining structure with a thermal grease to form a heat pipe;
    trimming the heat pipe to the perimeter of the top surface so that the heat pipe does not extend into the at least one corner of the top surface;
    placing the heat pipe on the top surface of the integrated circuit; and
    placing a thermal element on the impregnated retaining structure.

2. The method of claim 1, wherein the retaining structure is shaped as a mesh made of aluminum, wherein the mesh includes a plurality of openings, each opening measuring 2.9 mils in one direction and surrounded by mesh material having a diameter of 2.1 mils, the method further comprising:

TABLE I

Test Results of Mesh Material

| Mesh Material | Thermal Resistance (Celsius per Watt) | | Mesh Opening (mils) | Mesh Open Area (percent) | Mesh Count (per inch) | Thread Diameter (mils) | Fabric Thickness (mils) |
| --- | --- | --- | --- | --- | --- | --- | --- |
| | Pre 7500 Power Cycle | Post 7500 Power Cycle | | | | | |
| Aluminum | 0.79 | 0.75 | 4.6 | 31.0 | 120 | 3.7 | 7.6 |
| Aluminum | 0.80 | 0.74 | 4.6 | 31.0 | 120 | 3.7 | 7.6 |
| Aluminum | 0.63 | 0.61 | 2.9 | 34.0 | 200 | 2.1 | 4.4 |
| Aluminum | 0.61 | 0.61 | 2.9 | 34.0 | 200 | 2.1 | 4.4 |
| Copper | 0.62 | 0.62 | 7.8 | 61.0 | 100 | 2.2 | 4.6 |
| Copper | 0.69 | 0.66 | 7.8 | 61.0 | 100 | 2.2 | 4.6 |
| Nylon | 0.85 | 0.84 | 5.1 | 49.0 | 146 | 2.0 | 3.6 |
| Nylon | 0.80 | 0.90 | 5.1 | 49.0 | 146 | 2.0 | 3.6 |
| Nylon | 0.96 | 1.20 | 3.2 | 37.0 | 185 | 2.0 | 3.6 |
| Nylon | 0.87 | 0.99 | 3.2 | 37.0 | 185 | 2.0 | 3.6 |
| Polyester | 0.83 | 0.83 | 3.3 | 34.0 | 175 | 2.4 | 4.1 |
| Polyester | 0.87 | 0.91 | 3.3 | 34.0 | 175 | 2.4 | 4.1 |
| No Mesh | 0.51–0.69 | 0.72–0.92 | N/A | N/A | N/A | N/A | N/A |

Preferably, the mesh size is large enough to cover the surface area of the housing. This, in turn, will permit the thermal grease 142 to cover surface area 124 of housing 122 while restricting thermal grease 142 to a position between thermal element 128 and upper surface 126 of integrated circuit 114. Due to the thickness of strands 144, the mesh 140 may enclose an area that is less than the area of the top attaching the thermal element to the integrated circuit and attaching a solder ball to the substrate.

3. The method of claim 1, wherein the integrated circuit is enclosed in a housing and the housing is formed with an injection mold process.

\* \* \* \* \*

UNITED STATES PATENT AND TRADEMARK OFFICE
CERTIFICATE OF CORRECTION

PATENT NO. : 6,150,195
DATED : November 21, 2000
INVENTOR(S) : Chiu et al.

Page 1 of 1

It is certified that error appears in the above-identified patent and that said Letters Patent is hereby corrected as shown below:

Claim 17,
Line 4, delete "an" and insert -- the --.
Line 9, after "shaped mesh" insert -- wherein the retaining structure is shaped as a mesh made of aluminum, wherein the mesh includes a plurality of openings, each opening measuring 2.9 mils in one direction and surrounded by mesh material having a diameter of 2.1 mils; --.

Claim 18,
Lines 1-5, delete "wherein the retaining structure is shaped as a mesh made of aluminum wherein the mesh includes a plurality of openings, each opening measuring 2.9 mils in one direction and surrounded by mesh material having a diameter of 2.1 mils,".

Signed and Sealed this

Twelfth Day of March, 2002

Attest:

JAMES E. ROGAN
Attesting Officer
Director of the United States Patent and Trademark Office